US012652774B2

(12) United States Patent
Champigny et al.

(10) Patent No.: US 12,652,774 B2
(45) Date of Patent: Jun. 9, 2026

(54) EXTENSION FOR A SUPERCOMPUTER RACK

(71) Applicant: BULL SAS, Les Clayes-sous-bois (FR)

(72) Inventors: Christophe Champigny, Buc (FR);
Fabien Demange, Achères (FR);
Antoine Rochereau, Angers (FR); Tom Sieg, Maisdon sur Sève (FR)

(73) Assignee: BULL SAS, Les Clayes-sous-Bois (FR)

( * ) Notice: Subject to any disclaimer, the term of this patent is extended or adjusted under 35 U.S.C. 154(b) by 119 days.

(21) Appl. No.: 18/508,726

(22) Filed: Nov. 14, 2023

(65) Prior Publication Data

US 2024/0172387 A1    May 23, 2024

(30) Foreign Application Priority Data

Nov. 17, 2022    (EP) ..................................... 22306698

(51) Int. Cl.
  *H05K 7/14*        (2006.01)
  *H05K 7/20*        (2006.01)
(52) U.S. Cl.
  CPC ....... *H05K 7/1489* (2013.01); *H05K 7/20772* (2013.01)
(58) Field of Classification Search
  CPC .......................... H05K 7/1489; H05K 7/20772
  See application file for complete search history.

(56) References Cited

U.S. PATENT DOCUMENTS

| | | | | |
|---|---|---|---|---|
| 7,002,810 B1 * | 2/2006 | Becker | ................. | H05K 7/1421 |
| | | | | 361/825 |
| 9,444,193 B1 * | 9/2016 | Westman | ............. | H01R 13/502 |
| 9,648,784 B2 * | 5/2017 | Keisling | ............ | H05K 7/20218 |
| 9,986,653 B2 * | 5/2018 | Salinas | ................ | H05K 5/0209 |
| 10,349,557 B2 * | 7/2019 | Bilski, Jr. | ......... | H05K 7/20681 |
| 10,448,539 B2 * | 10/2019 | Keisling | ............ | H05K 7/20609 |
| 11,132,035 B2 * | 9/2021 | Lewis, II | .................. | G06F 1/20 |
| 11,388,833 B2 * | 7/2022 | Gao | ..................... | H05K 7/1401 |
| 2004/0190270 A1 * | 9/2004 | Aldag | ................ | H05K 7/20572 |
| | | | | 361/752 |

(Continued)

FOREIGN PATENT DOCUMENTS

CN        113365477 A        9/2021

OTHER PUBLICATIONS

Search Report issued in EP22306698.6 dated Apr. 25, 2023 (9 pages).

*Primary Examiner* — Monica E Millner

(74) *Attorney, Agent, or Firm* — ARC IP Law, PC; Joseph J. Mayo

(57)        ABSTRACT

An extension for a supercomputer rack, the extension including a reinforcement frame, defining a rectangular through-opening, and at least one fluidic connection support mounted to the reinforcement frame. The at least one fluidic connection support includes an upstream circuit, configured to convey a refrigerant liquid to a plurality of connectors configured to be each connected via a cold flexible manifold to a cooling circuit of a compute blade of a server, and a downstream circuit, configured to collect the heated refrigerant liquid having passed through a compute blade of a server via a hot flexible manifold and a plurality of collection connectors. The extension is configured to be positioned at a rear end of the rack.

11 Claims, 3 Drawing Sheets

(56)        References Cited

U.S. PATENT DOCUMENTS

| | | | |
|---|---|---|---|
| 2004/0264145 A1* | 12/2004 | Miller | H05K 7/1489 |
| | | | 361/725 |
| 2007/0144993 A1* | 6/2007 | Knoop | H05K 7/1495 |
| | | | 211/189 |
| 2008/0037228 A1* | 2/2008 | Lewis, II | H05K 7/183 |
| | | | 361/724 |
| 2008/0266789 A1* | 10/2008 | Hruby | H05K 7/20572 |
| | | | 361/692 |
| 2009/0225513 A1* | 9/2009 | Correa | H05K 7/20781 |
| | | | 361/700 |
| 2009/0273915 A1* | 11/2009 | Dean, Jr. | H04Q 1/062 |
| | | | 361/826 |
| 2010/0033931 A1* | 2/2010 | Miyazawa | H05K 7/20745 |
| | | | 29/890.03 |
| 2012/0155027 A1* | 6/2012 | Broome | H05K 7/2039 |
| | | | 361/688 |
| 2013/0309957 A1* | 11/2013 | Fleming | H05K 7/20145 |
| | | | 29/428 |
| 2015/0282349 A1* | 10/2015 | Mann | A47B 96/00 |
| | | | 312/283 |
| 2016/0066478 A1 | 3/2016 | Van Den Bergen | |
| 2017/0181324 A1* | 6/2017 | Shelnutt | H05K 7/20781 |
| 2018/0242478 A1 | 8/2018 | Cui et al. | |
| 2019/0182989 A1* | 6/2019 | Chen | H05K 7/20781 |
| 2021/0251097 A1 | 8/2021 | Gao | |

* cited by examiner

EXTENSION FOR A SUPERCOMPUTER RACK

This application claims priority to European Patent Application Number 22306698.6, filed 17 Nov. 2022, the specification of which is hereby incorporated herein by reference.

BACKGROUND OF THE INVENTION

Technical Field of the Invention

At least one embodiment of the invention relates to the field of cooling the compute blades and relates more particularly to an extension for a supercomputer rack.

Description of the Related Art

Compute blades for servers generally comprise electronic boards, especially comprising processors, which release heat and therefore have to be cooled. Initially, these electronic boards were air-cooled, especially in the case where these blades are assembled in racks of standard size 60 centimeters wide.

However, for efficiency reasons, cooling with liquid circuits has developed in the industry. To adapt this type of circuit to an existing rack, it is necessary to add a liquid distribution circuit that takes the form of a set of manifolds, attached inside the rear part of the rack and which distribute cooling liquid in the compute blades.

However, the set of manifolds can obstruct the blades' exit to ensure maintenance thereof. Indeed, the blades have a standardized width of 435 mm and the thickness added on each side by the manifolds is 10 cm. The presence of the manifolds makes it difficult to extract the blades, which can collide with the manifolds and damage, especially pierce the same, during operation.

It would therefore be advantageous to provide a simple, reliable and effective solution to at least partially remedy these drawbacks.

BRIEF SUMMARY OF THE INVENTION

To this end, at least one embodiment of the invention is firstly an extension for a supercomputer rack, said rack having a parallelepipedal shape comprising a front face, an open rear face and two side walls and being configured to receive a plurality of vertically superimposed servers, each server comprising at least one compute blade adapted to be inserted into and removed from said server by sliding through the rear face of the rack, said extension comprising a reinforcement frame defining a rectangular through-opening and comprising at least one fluidic connection support mounted to said reinforcement frame and comprising an upstream circuit, configured to convey a refrigerant liquid to a plurality of injection connectors configured to be each connected via a so-called "cold" flexible manifold to a cooling circuit of a compute blade of one of the servers, and a downstream circuit, configured to collect the heated refrigerant liquid having passed through the compute blades of the servers via a so-called "hot" flexible manifold and a plurality of collection connectors, the extension being configured to be positioned at the rear of the rack, especially against the rear face of the rack, such that the compute blades can be extracted through the rectangular through-opening defined by the reinforcement frame.

The rack extension according to one or more embodiments the invention makes it possible to offset the at least one fluidic connection support in order to ensure attachment of the manifolds of the cooling system outside the rack while forming a space sufficiently wide to allow the compute blades to be removed without coming into contact with the manifolds of the cooling system, thus avoiding damage to the same during passage. The rack extension according to at least one embodiment of the invention is advantageously adaptable to existing equipment, in particular to standard 60 cm racks. An alternative solution would have been to use a larger rack, for example 80 centimeters. However, such a solution would involve changing the existing standard 60 cm racks, which would have a significant drawback. Indeed, as these 60 cm standard racks are widely used, production teams are extensively trained on these racks. Further, these standard 60 cm racks have the advantage of being transportable when loaded (that is, with all its components already wired), which avoids additional labor during installation at the customer's site.

According to at least one embodiment of the invention, the reinforcement frame extends along a plane having a rectangular shape and comprises two vertical posts and two horizontal posts.

In at least one embodiment, the extension is configured to be mounted or attached to the rear face of the rack in order to secure the extension to said rack, for example using a screw system, in order to make it integral with the rack and thus prevent it from moving relative to said rack.

In one or more embodiments, the extension comprises two fluidic connection supports in order to connect and cool more compute blades.

In at least one embodiment, the at least one fluidic connection support is mounted inside the reinforcement frame, that is, in the internal space defined between the posts of the reinforcement frame.

According to at least one embodiment of the invention, the at least one fluidic connection support is mounted integrally in the reinforcement frame such that the compute blades can be extracted through the entire rectangular through-opening defined by the reinforcement frame without colliding with said at least one fluidic connection support.

According to one or more embodiments of the invention, the at least one fluidic connection support is mounted vertically to the reinforcement frame in order to enable efficient distribution of the refrigerant liquid. For example, in at least one embodiment, the at least one fluidic connection support can be mounted vertically to one of the vertical posts of the reinforcement frame, especially inside the frame or on the outside of the frame. In particular, in at least one embodiment, the at least one fluidic connection support is arranged vertically inside the reinforcement frame against the inner wall of a vertical post of the reinforcement frame so as to integrate into said reinforcement frame while allowing efficient operation of the at least one fluidic connection support when said at least one fluidic connection support is in operation.

In one or more embodiments, the at least one fluidic connection support is attached to the reinforcement frame, for example using a screw system, in order to make it integral with the reinforcement frame, for example in order to be able to move said reinforcement frame easily.

According to at least one embodiment of the invention, the at least one fluidic connection support comprises a first duct, defining the upstream circuit, and a second duct, defining the downstream circuit.

In at least one embodiment, the first duct and the second duct are parallel.

Advantageously, in one or more embodiments, the first duct and/or the second duct comprises a plurality of connectors each configured to receive the end of a flexible manifold for fluidic connection to a compute blade.

In at least one embodiment, the connectors of the first duct and/or the second duct extend in parallel to the plane of the reinforcement frame.

In at least one embodiment, the connectors of the first duct and/or the second duct extend orthogonally to the plane of the reinforcement frame.

According to at least one embodiment of the invention, the extension comprises at least one, preferably height-adjustable, support leg mounted under the reinforcement frame in order to be able to precisely position the rectangular through-opening in front of the open rear face of the rack.

In one or more embodiments, the extension comprises four support legs in order to enhance the stability of the reinforcement frame.

In at least one embodiment, the reinforcement frame of the extension is made of aluminum for the thermal conduction of the material. Aluminum effectively discharges part of the heat associated with the circulation of heated liquid in the downstream circuit after the liquid has circulated through the circuits of the compute blade.

In at least one embodiment, the extension comprises at least one wedge attached to the reinforcement frame.

In one or more embodiments, the at least one wedge is attached to a vertical post of the reinforcement frame.

At least one embodiment of the invention also relates to an extended supercomputer rack, said rack having a parallelepipedal shape and comprising a front face, an open rear face and two side walls and being configured to receive a plurality of vertically superimposed servers, each server comprising at least one compute blade adapted to be inserted into and removed from said server by sliding through the rear face of the rack, the extended rack comprising an extension as previously set forth positioned opposite to the rear face of the rack.

In one or more embodiments, the extension is attached to the rear face of said rack in order to secure them to each other.

In at least one embodiment, the reinforcement frame has a width greater than the width of the rack in order to allow the removal of the compute blades without damaging the flexible manifolds.

According to at least one embodiment of the invention, the extended rack comprises a plurality of vertically superimposed servers, each server comprising at least one compute blade adapted to be inserted into and removed from said server by sliding through the rear face of the rack.

At least one embodiment of the invention also relates to a system comprising at least two extended racks as previously set forth and at least one wedge positioned between said extended racks in order to space them and align them with each other.

The use of wedges allows aligning several racks comprising or not an extension. These alignments are preferable when managing multiple supercomputer racks in data centers.

In one or more embodiments, the at least one wedge is attached to at least one wall of at least one rack.

In one or more embodiments, the at least one wedge is attached to at least one side wall of at least one rack.

In one or more embodiments, the at least one wedge is attached to the rack extension.

In one or more embodiments, the at least one wedge is aligned with an outer side edge of the extension.

BRIEF DESCRIPTION OF THE DRAWINGS

Further characteristics and advantages of the invention will further appear upon reading the description that follows. This is purely illustrative and should be read in conjunction with the appended drawings in which.

DETAILED DESCRIPTION OF THE INVENTION

Figure 1:
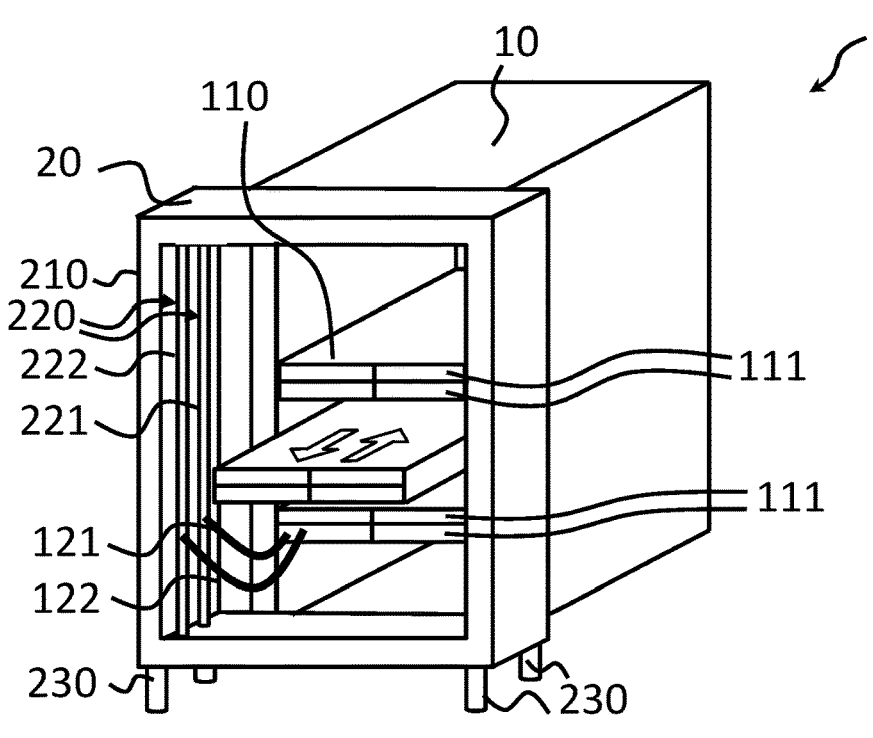
FIG. 1 schematically illustrates the extended rack according to one or more embodiments of the invention.

FIG. 1 illustrates an example of extended rack 1 according to one or more embodiments of the invention.

Extended Rack 1

The extended rack 1 comprises a rack 10 and an extension 20.

Rack 10

Figure 2:
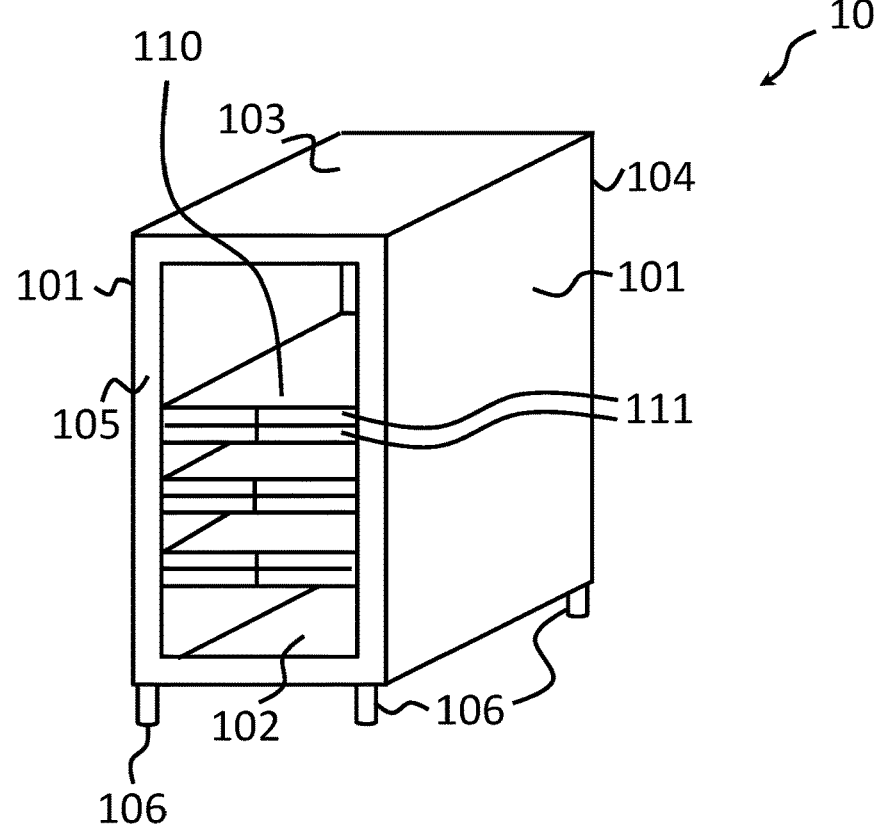
FIG. 2 schematically illustrates the rack of FIG. 1, according to one or more embodiments of the invention.

With reference to FIG. 2, by way of one or more embodiments, the rack 10 has a substantially parallelepipedal shape and comprises two side walls 101, a bottom 102, an upper wall 103, a front face 104, a rear face 105, support legs 106 and a plurality of servers 110.

The servers 110 are mounted superimposed to supports attached between the side walls 101. The front face 104 may be provided with one or more doors (not visible in the figures). The rear face 105 has an open rectangular shape to allow access to the servers 110 in order especially to perform their maintenance.

In this example, still with reference to FIG. 2, each server 110 comprises four compute blades 111. In at least one embodiment, each server 110 could comprise more or less than four compute blades 111.

Each compute blade 111 comprises electrical and/or electronic components, especially one or more processors (not represented) for carrying out computing tasks and processing data.

Each compute blade 111 comprises a cooling circuit allowing the electrical and/or electronic components, especially the processors, to be cooled using a cooling liquid circulating in said circuit.

To this end, each compute blade 111 comprises a so-called "cold" inlet connector (not visible), adapted to receive cooling liquid from a cooling module (not represented) external to the rack 10, and a so-called "hot" outlet connector (not visible), adapted to discharge the cooling liquid that has been heated by the electrical and/or electronic components when passing through the cooling circuit of the compute blade 111 in order to convey it to the external cooling module for cooling or regeneration. As such an external cooling module is known per se, it will not be further detailed here.

A so-called "cold" flexible manifold 121 is connected to the cold inlet connector and a so-called "hot" flexible manifold 122 is connected to the hot outlet connector.

Extension 20

Figure 3:
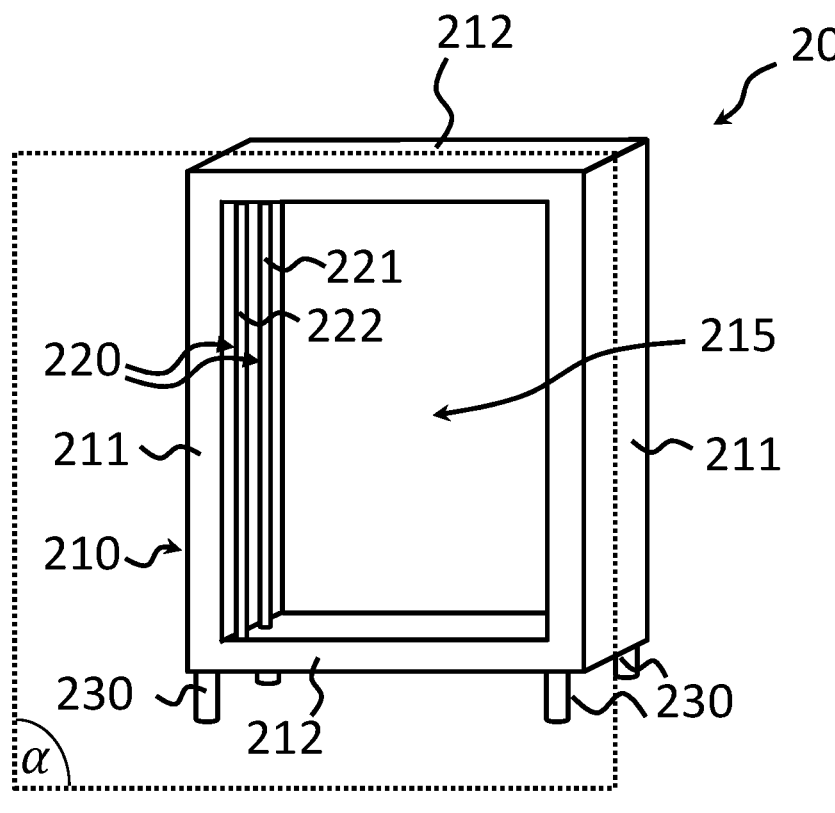
FIG. 3 schematically illustrates the reinforcement of the extension of the rack of FIG. 1, according to one or more embodiments of the invention.

With reference to FIG. 3, by way of one or more embodiments, the extension 20 comprises a reinforcement frame 210, two fluidic connection supports 220, and support legs 230.

Reinforcement Frame 210

Still with reference to FIG. 3, by way of at least one embodiment, the reinforcement frame 210 has a rectangular shape and extends in a plane a parallel to the rear face 105 of the rack 10.

The reinforcement frame 210 comprises two vertical posts 211 forming the sides of the reinforcement frame 210 and two horizontal cross members 212, forming the upper part and the lower part of the reinforcement frame 210, respectively.

The reinforcement frame 210 delimits a rectangular through-opening 215 configured to come opposite to the open rear face 105 of the rack 10.

The reinforcement frame 210 has a width greater than the width of the rack 10 in order to allow removal of the compute blades 111 without damaging the flexible manifolds.

Fluidic Connection Support 220

With reference to FIGS. 1 and 3, by way of one or more embodiments, the fluidic connection supports 220 are arranged vertically against the inner wall of the vertical posts 211 of the reinforcement frame 210. In other words, in at least one embodiment, the fluidic connection supports 220 are arranged facing each other inside the reinforcement frame 210. For the sake of clarity, only one fluidic connection support 220 has been represented in the figures.

Each fluidic connection support 220 comprises a first duct 221 defining an upstream circuit for conveying cold cooling liquid from the external cooling module and a second duct 222 defining a downstream circuit for evacuating heated cooling liquid to the external cooling module.

As illustrated in FIG. 1, in one or more embodiments, the first duct 221 and the second duct 222 extend vertically in the reinforcement frame 210 substantially over the height of the servers 110 in order to supply all of the compute blades 111 with refrigerant liquid, for example, water.

The first duct 221 and the second duct 222 may be made of metal, for example steel.

In at least one embodiment, the fluidic connection support (s) could be mounted horizontally to one of the horizontal cross members 212 of the reinforcement frame 210.

Figure 4:
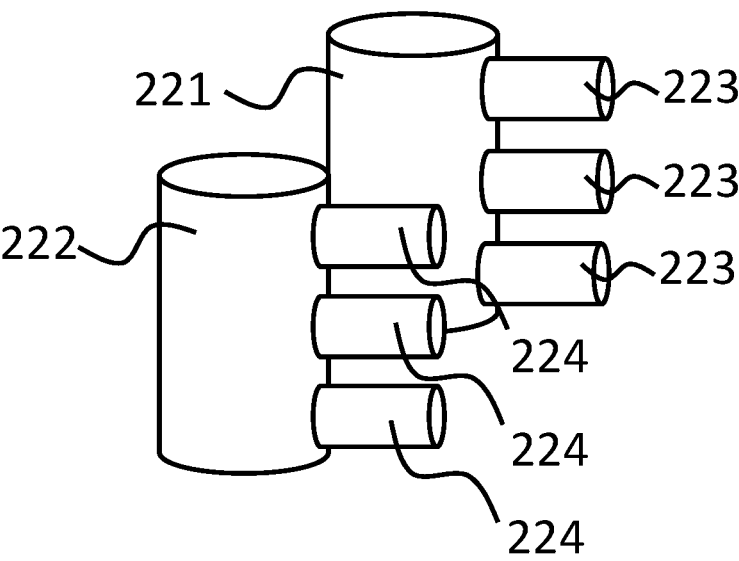
FIG. 4 schematically illustrates the fluidic connection supports of the extension of FIG. 3, according to one or more embodiments of the invention.

With reference to FIG. 4, in one or more embodiments, the first duct 221 comprises a plurality of injection connectors 223 to which the cold flexible manifolds 121 are connected which allow the compute blades 110 to be connected to the first duct 221.

The second duct 222 comprises a plurality of collection connectors 224 to which the hot flexible manifolds 122 are connected which allow the compute blades 110 to be connected to the second duct 222.

The first duct 221 is connected to the external cooling module in order to receive the cold cooling liquid.

The second duct 222 is connected to the external cooling module in order to discharge the heated cooling liquid.

In at least one embodiment, the minimum between the width of the through-opening 215 and the width between the connectors 223, 224 of the two vertical fluidic connection supports 220 is greater than the width of a server 110 increased by at least 20 cm in order to ensure the passage of the compute blades 111 without damaging the cold flexible manifolds 121 and the hot flexible manifolds 122.

Support Legs 230

In this non-limiting example, the extension 20 comprises four, preferably adjustable, support legs 230.

The support legs 230 make it possible to position the rectangular through-opening 215 exactly opposite to the open rear face 105 of the rack 10 so as to be able to remove the compute blades 111 through said through-opening 215.

In at least one embodiment, the extension 20 could comprise more or less than four support legs 230.

In one or more embodiments, each support leg 230 is provided with a rubber pad to prevent the extension 20 from moving once installed.

System 100

Figure 5:
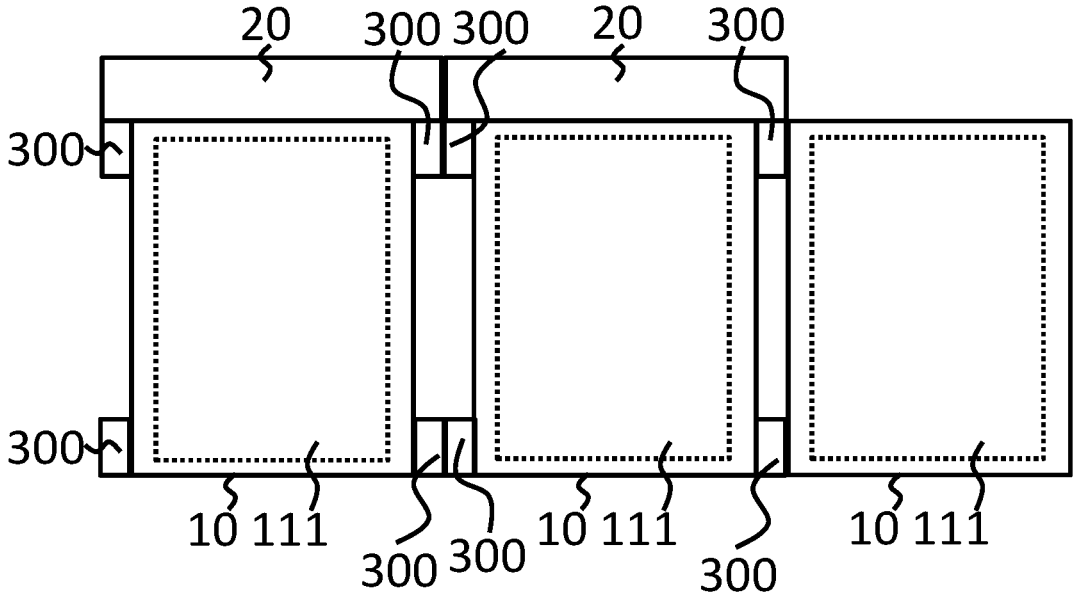
FIG. 5 schematically illustrates an example of rack alignment according to one or more embodiments of the invention.

FIG. 5 represents a system 100 formed of three racks 10, two of which are fitted with an extension 20, in top view, according to one or more embodiments of the invention.

The racks 10 are arranged side by side aligned with each other.

Wedges 300 are placed between the racks 10 to facilitate this alignment while allowing the racks 10 to be wedged against each other. These wedges 300 take the form of parallelepipedal-shaped beams arranged vertically between the racks 10 and whose width is equal to the width of the extension protruding from the side wall 101 of the rack 10.

The wedges 300 can be attached to the side walls 101 of the racks 10 and/or to the reinforcement frame 210 of the extension 20.

Example of Implementation

The rack 10 is installed in a compute center, the servers 110 and the compute blades 111 being mounted inside.

The extension 20 is positioned on the rear face 105 of the rack 10 and the height of the extension 20 is adjusted to that of the rack 10, if necessary by means of the adjustable legs 230 such that said rear face 105 of the rack 10 is fully visible and accessible when the flexible manifolds 121, 122 are connected between the connectors 123 and the compute blades 111.

In at least one embodiment, the extension 20 is attached to the rear part of the rack 10, for example by screwing the reinforcement frame 210 onto pre-existing supports of the rack 10 adapted to receive rear doors. In another embodiment, the extension 20 could be attached to the rack 10 by any other suitable means of attachment (hooks, rods, etc.).

For each compute blade 111 of the rack 10, a cold flexible manifold 121 is connected on the one hand to the inlet connector of said compute blade 111 and on the other hand to a connector 223 of the first duct 221. Similarly, for each compute blade 111 of the rack 10, a hot flexible manifold 122 is connected on the one hand to the outlet connector of said compute blade 111 and on the other hand to a connector 224 of the second duct 222.

The width of the rectangular through-opening defined between the posts of the reinforcement frame 210 allows carrying out the maintenance operations of the compute blades 111, especially the removal and insertion of the compute blades 111 from and into the rack 10, without colliding with the flexible manifolds 121 and 122 or the connectors 223 and 224.

In one or more embodiments, the width of the rectangular through-opening 215 is greater than or equal to the width of the opening of the rack 10, which can for example be 48.26 cm (that is, 19 inches) as standard.

A non-limiting example of installation of a system 100 of racks 10 according to one or more embodiments of the invention will now be described.

Several extended racks 10 according to at least one embodiment of the invention may be arranged side by side, as illustrated in FIG. 5. Wedges 300 can then be placed between the racks 10 in twos by being attached to the rack 10 and/or to the extension 20, thereby allowing the racks 10 to be aligned and spaced evenly.

The at least one embodiment of the invention allows the use of rack 10 of standard dimensions, for example 60 cm wide, without risk of damaging the flexible manifolds when removing or inserting the compute blades 111.

What is claimed is:

1. An extension for a supercomputer rack, said supercomputer rack having a parallelepipedal shape comprising a front face, an open rear face and two side walls and being configured to receive a plurality of vertically superimposed servers, wherein each server of said plurality of vertically superimposed servers comprises at least one compute blade adapted to be inserted into and removed from said each server by sliding through the open rear face of said supercomputer rack, said extension comprising:

a reinforcement frame comprising a rectangular through-opening, and at least one fluidic connection support mounted integrally in the reinforcement frame, wherein each fluidic connection support of said at least one fluidic connection support is arranged vertically against an inner wall of a vertical post of the reinforcement frame, wherein each fluidic connection support of said at least one fluidic connection support comprises an upstream circuit, configured to convey a refrigerant liquid to a plurality of connectors configured to be each connected via a cold flexible manifold to a cooling circuit of a compute blade of one of the plurality of vertically superimposed servers, and a downstream circuit, configured to collect the refrigerant liquid that is heated having passed through the compute blade of said each server of the plurality of vertically superimposed servers via a hot flexible manifold and a plurality of collection connectors, wherein the extension is configured to be positioned at a rear end of the supercomputer rack, wherein the reinforcement frame has a width greater than a width of the supercomputer rack.

2. The extension according to claim 1, wherein said extension is configured to be attached to the open rear face of the supercomputer rack.

3. The extension according to claim 1, wherein the at least one fluidic connection support is mounted vertically in the reinforcement frame.

4. The extension according to claim 1, wherein the at least one fluidic connection support is attached inside the reinforcement frame.

5. The extension according to claim 1, wherein the at least one fluidic connection support is mounted horizontally to the reinforcement frame.

6. The extension according to claim 1, wherein said extension further comprises at least one support leg mounted under the reinforcement frame.

7. The extension according to claim 6, wherein said at least one support leg comprises four support legs.

8. The extension according to claim 1, wherein the at least one fluidic connection support comprises a first duct, defining the upstream circuit, and a second duct, defining the downstream circuit, wherein the plurality of connectors of the first duct and the plurality of connectors of the second duct extend in parallel to a plane of the reinforcement frame.

9. The extension according to claim 1, wherein the reinforcement frame is made of aluminum.

10. A supercomputer extended rack, said supercomputer extended rack comprising:

a rack having a parallelepipedal shape and comprising a front face, an open rear face, and two side walls, and wherein said rack is configured to receive a plurality of vertically superimposed servers, wherein each server of said plurality of vertically superimposed servers comprises at least one compute blade adapted to be inserted into and removed from said each server by sliding through the open rear face of the rack, wherein the supercomputer extended rack further comprises an extension comprising a reinforcement frame comprising a rectangular through-opening, and at least one fluidic connection support mounted integrally in the reinforcement frame, wherein each fluidic connection support of said at least one fluidic connection support is arranged vertically against an inner wall of a vertical post of the reinforcement frame, wherein each fluidic connection support of said at least one fluidic connection support comprises an upstream circuit, configured to convey a refrigerant liquid to a plurality of connectors configured to be each connected via a cold flexible manifold to a cooling circuit of a compute blade of one of the plurality of vertically superimposed servers, and a downstream circuit, configured to collect the refrigerant liquid that is heated having passed through the compute blade of said each server of the plurality of vertically superimposed servers via a hot flexible manifold and a plurality of collection connectors, wherein the extension is configured to be positioned at a rear end of the rack, wherein the reinforcement frame has a width greater than a width of the rack.

11. The supercomputer extended rack according claim 10, wherein the extension is attached to the open rear face of said rack.

* * * * *